(12) United States Patent
Mosier et al.

(10) Patent No.: US 8,456,846 B2
(45) Date of Patent: Jun. 4, 2013

(54) WEDGE BASED CIRCUIT BOARD RETAINER

(75) Inventors: David W. Mosier, Raleigh, NC (US); Rodney G. Bame, Raleigh, NC (US)

(73) Assignee: Wavetherm Corporation, Morrisville, NC (US)

( * ) Notice: Subject to any disclaimer, the term of this patent is extended or adjusted under 35 U.S.C. 154(b) by 297 days.

(21) Appl. No.: 12/984,225

(22) Filed: Jan. 4, 2011

(65) Prior Publication Data

US 2011/0176867 A1    Jul. 21, 2011

Related U.S. Application Data

(60) Provisional application No. 61/296,703, filed on Jan. 20, 2010.

(51) Int. Cl.
*H05K 7/00* (2006.01)
(52) U.S. Cl.
USPC .......................... 361/728; 361/802; 361/803
(58) Field of Classification Search
USPC ......... 361/801–803, 807, 809, 810, 728–732; 174/16.3; 211/41; 165/80.1, 80.3, 80.4, 185
See application file for complete search history.

(56) References Cited

U.S. PATENT DOCUMENTS

| | | | |
|---|---|---|---|
| 3,904,933 A | 9/1975 | Davis | |
| 4,480,287 A | 10/1984 | Jensen | |
| 4,819,713 A | 4/1989 | Weisman | |
| 4,823,951 A | 4/1989 | Colomina | |
| 4,879,634 A | 11/1989 | Storrow et al. | |
| 5,010,444 A | 4/1991 | Storrow et al. | |
| 5,057,968 A * | 10/1991 | Morrison | 361/700 |
| 5,071,013 A * | 12/1991 | Peterson | 211/26 |
| 5,414,592 A * | 5/1995 | Stout et al. | 361/704 |
| 5,472,353 A | 12/1995 | Hristake et al. | |
| 5,485,353 A | 1/1996 | Hayes et al. | |
| 5,607,273 A * | 3/1997 | Kecmer et al. | 411/79 |
| 5,859,784 A | 1/1999 | Sawahata | |
| 5,887,435 A | 3/1999 | Morton | |
| 6,212,075 B1 | 4/2001 | Habing et al. | |
| 6,239,972 B1 | 5/2001 | Tehan et al. | |
| 6,246,582 B1 | 6/2001 | Habing et al. | |
| 6,678,159 B1 | 1/2004 | Barcley | |
| 6,687,130 B2 * | 2/2004 | Adams et al. | 361/740 |
| 6,765,798 B1 | 7/2004 | Ratliff et al. | |
| 6,873,528 B2 | 3/2005 | Hulan et al. | |
| 7,031,167 B1 | 4/2006 | Zagoory et al. | |
| 7,349,221 B2 | 3/2008 | Yurko | |
| 7,483,271 B2 * | 1/2009 | Miller et al. | 361/704 |

(Continued)

*Primary Examiner* — Hung S Bui
(74) *Attorney, Agent, or Firm* — Coats and Bennett PLLC

(57) ABSTRACT

A locking retainer for retaining an electronic module or printed circuit card in slots of a chassis. The retainer includes at least three wedge members movably linked to each other and disposed in longitudinal sequence along a longitudinal axis. The retainer can be made relatively larger in height by moving the wedge members longitudinally such that a longitudinal distance between a first wedge member and a last wedge member of the sequence becomes smaller without the wedge members being longitudinally displaced along a common internal longitudinal element. All portions of the locking retainer that the middle wedge member is longitudinally moveable relative to do not extend through a theoretical plane disposed at a longitudinal midpoint of the middle wedge member and oriented normal to the longitudinal axis. The elimination of a central rail permits the wedge segments to have much greater contact area for greater thermal energy flow.

20 Claims, 10 Drawing Sheets

U.S. PATENT DOCUMENTS

| | | |
|---|---|---|
| 8,045,332 B2 * | 10/2011 | Lee et al. .................. 361/759 |
| 2003/0223197 A1 | 12/2003 | Hulan et al. |
| 2004/0070944 A1 | 4/2004 | Wells et al. |
| 2011/0261537 A1 | 10/2011 | Sporer et al. |

* cited by examiner

SECTION
A-A

WEDGE BASED CIRCUIT BOARD RETAINER

This application claims the benefit of U.S. Provisional Application No. 61/296,703, filed 20 Jan. 2010.

BACKGROUND

The present invention relates to electronics system configurations, particularly those that use removable circuit board modules using a clamping mechanism known commonly as circuit board retainers or card retainers and that are required to pass stringent shock and vibration requirements.

Many harsh environment electronics systems, such as computer and telecommunications systems, are designed to use replaceable electronic circuit boards, sometimes referred to as Line Replaceable Units (LRUs). An LRU is a modular circuit board that is designed to plug into a chassis and electrically connect to other LRU boards via a backplane in the chassis. Typically, a given chassis is designed to hold multiple LRUs. In general LRUs must comply with pre-determined specifications so that modules provided by various manufacturers may be readily used in combination. Example standards are, but are not limited to, VME, VME 64, cPCI, ATCA, AMC, ARINC, and MicroTCA, with these standards being defined by several organizations including ANSI, PICMG, IEEE, VITA, and other standards organizations.

Electronics systems for extreme environments rely on LRUs that are designed for high shock and vibration. Further, because these modules contain electronics that generate heat, a suitable method to dissipate heat efficiently is desired. To achieve thermal and structural performance, a clamping device known as a card retainer is employed to secure the LRU to the chassis and, in the case of conduction cooling, to provide a thermal pathway to dissipate heat from the module to the walls of the chassis enclosure.

It is common for these standards to require that the LRUs are removable and are typically inserted perpendicular to the chassis walls. Once the LRU is inserted, a card retainer is employed to secure the LRU to the chassis wall. In addition to providing a clamping mechanism to retain the module, a card retainer in a conduction cooled application can also provide an efficient method of transmitting thermal energy from the module to the walls of the enclosure.

Typically card retainers use a series of ramps or wedges that are forced to slide onto one another to clamp the LRU to the chassis. The wedges slide onto one another at an acute angle, typically at 45°. The action of the wedges sliding one above the next create an expansion of effective height of the total assembly which creates a frictional force that holds the LRU in place and creates a conductive path, for conduction cooled applications, for the thermal energy from the LRU.

In the prior art, the card retainer employs a central support member consisting of a long bar, a screw, or a shaft that connects and aligns all wedges. For example, see U.S. Pat. Nos. 4,819,713; 4,823,951; and 5,485,353. A screw or lever then can apply linear force to the aligned wedge segments to force the wedges towards one another converting horizontal force to vertical force. The supporting member or shaft that connects all of the wedges to one another is typically positioned through the center of all of the wedges.

While the above arrangements have proven satisfactory for many situations, they may be less than satisfactory for others, particularly for high heat load situations. As such, there remains a need for alternative approaches for more efficient cooling and better structural clamping force to retain the LRUs.

SUMMARY

The present invention provides a locking retainer for retaining an electronic module or printed circuit card in slots of a chassis, and related assemblies and methods.

In some embodiments, the retainer includes at least three wedge members movably linked to each other and disposed in longitudinal sequence along a longitudinal axis. The retainer can be made relatively larger in height by moving the wedge members longitudinally such that a longitudinal distance between a first wedge member and a last wedge member of the sequence becomes smaller without the wedge members being longitudinally displaced along a common internal longitudinal element. All portions of the locking retainer that the middle wedge member is longitudinally moveable relative to do not extend through a theoretical plane disposed at a longitudinal midpoint of the middle wedge member and oriented normal to the longitudinal axis. The elimination of a central rail permits the wedge segments to have much greater contact area for greater thermal energy flow.

In some embodiments, the locking retainer comprises at least three wedge members movably linked to each other and disposed in longitudinal sequence along a longitudinal axis; the at least three wedge members comprising a middle wedge member disposed between the other two of the three wedge members. The locking retainer is movable between a first configuration having a relatively smaller height and a second configuration having a relatively larger height by moving the wedge members longitudinally such that a longitudinal distance between a first wedge member and a last wedge member of the sequence becomes smaller without the wedge members being longitudinally displaced along a common internal longitudinal element. All portions of the locking retainer that the middle wedge member is longitudinally moveable relative to do not extend through a theoretical plane disposed at a longitudinal midpoint of the middle wedge member and oriented normal to the longitudinal axis. Such embodiment may further comprise a plurality of links moveably connecting adjacent wedge members but distinct therefrom; wherein each link contacts at least two, but not more than three wedge members. The locking retainer may, in the first configuration, comprise a longitudinally extending centerline, with respective cross-sectional lines through each wedge member extending normal the centerline and in a plane containing the centerline are not more than 20%, and advantageously not more than 15%, open. The middle and a second wedge member adjacent thereto may have respective angled wedge bearing surfaces angled at an angle; wherein, in the second configuration, the middle and second wedge members are in contact with each other at their interface across at least 50%, and advantageously 70%, of a cross-sectional area of the locking retainer at that angle at the interface.

In some embodiments, a locking retainer assembly may comprise a substrate; an elongate locking retainer anchored to the substrate; the locking retainer changeable in height. The locking retainer may comprise: a proximal mounting segment; a distal anchor segment; one or more intermediate wedge members disposed between the mounting block and the anchor segment in longitudinal sequence. The mounting segment and the distal anchor segment are secured to the substrate in fixed relation thereto; wherein all intermediate wedge members are longitudinally movable relative to both the substrate and the distal anchor segment. The locking retainer is movable between a first configuration having a relatively smaller height and a second configuration having a relatively larger height by moving the intermediate wedge member away from the proximal mounting segment toward the distal anchor segment with the proximal mounting segment and the distal anchor remaining in fixed positions relative to the substrate. There may be three or more intermediate wedge members, and there may be a plurality of links connecting adjacent intermediate wedge members. The links may mount to only two wedge members, or may mount to not more than three wedge members. The substrate may be a circuit board or a housing module generally surrounding one or more circuit boards. First and second adjacent wedge members may have respective angled wedge bearing surfaces angled at an angle; wherein, in the second configuration, the first and second wedge members are in contact with each other at their interface across at least 70% of a cross-sectional area of the locking retainer at that angle at the interface. The one or more intermediate wedge members may each comprise lateral through passages.

In some embodiments, the locking retainer may comprise: a plurality of wedge members including at least a first, second, third, fourth, and fifth wedge members arranged sequentially along a longitudinal axis, with the first wedge member disposed most proximally and the fifth wedge member disposed most distally. A plurality of links movably connecting adjacent wedge members; wherein no link extends for more than three wedge members. A mounting segment is disposed proximally from the first wedge member. The retainer is moveable between a retracted configuration and an extended configuration; wherein, in the retracted configuration: 1) the retainer has first height normal to the longitudinal axis; 2) the mounting segment and the fifth wedge are separated by a first distance; 3) the first wedge and fifth wedge are separated by a second distance. In the extended configuration: 1) the retainer has second height normal to the longitudinal axis; the second height greater than the first height; 2) the mounting segment and the fifth wedge are separated by the first distance; 3) the first wedge and fifth wedge are separated by a third distance; the third distance less than the second distance. The adjacent wedge members may be pivotally linked to each other. The retainer may further comprise a sixth wedge member and a seventh wedge member disposed sequentially between the fourth wedge member and the fifth wedge member. The second, third, and fourth wedge members may each include angled bearing faces on their respective proximal and distal ends.

In various embodiments, the present invention has one or more of the above attributes, alone or in any combination.

DETAILED DESCRIPTION

In one embodiment, the present invention is directed to a card retaining device for LRUs. The card retainer provides a clamping mechanism that eliminates the need for the primary central support member or shaft. The card retainer employs a series of guide straps (or links) to moveably connect each adjacent wedge together in a sequence. Depending on the embodiment, the guide straps connect each wedge to the adjacent wedge such that any given guide strap engages three or fewer wedge segments, and sometimes only two wedge segments. The result is an increase in the cross sectional area of the ramps or wedges. This arrangement provides more efficient clamping force and better thermal transmission.

Figure 1:
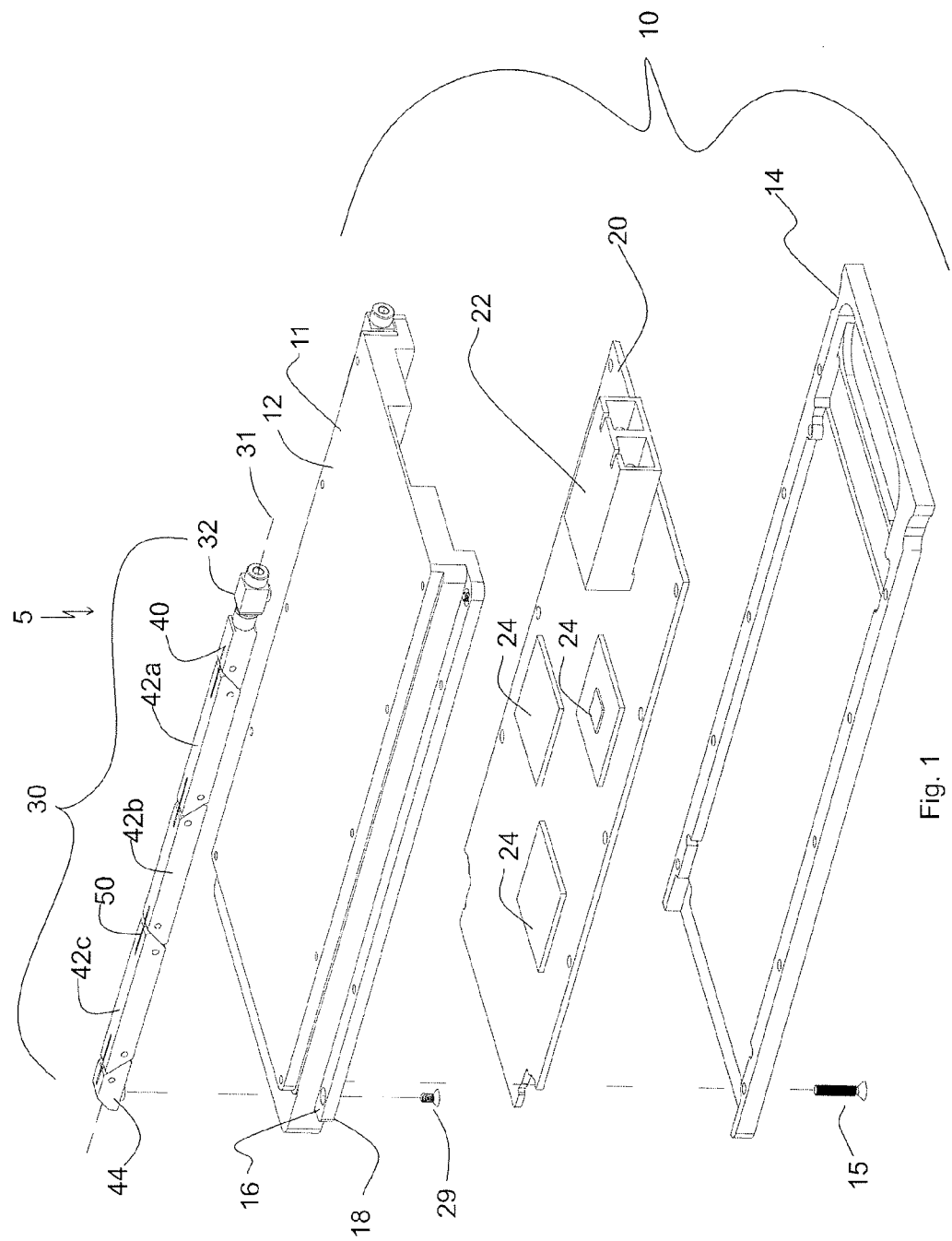
FIG. 1 shows an exploded LRU module assembly.

In one embodiment illustrated in FIG. 1, an LRU module assembly 5 includes an LRU module 10 and one or more card retainers 30. The LRU module 10 includes a frame or housing 11 and at least one circuit board 20 secured to the frame. The frame 11 includes a top frame 12 secured to a bottom frame 14 via screws 15. The top frame 12 includes a card retainer contact surface 16 for engaging the card retainer 30 and a module contact surface 18 for engaging the chassis 70 to which the LRU module 10 is mounted. The screws 15 may, if desired, pass through suitable holes in circuit board 20, or the edge of the circuit board 20 may simply be clamped between the top frame 12 and the bottom frame 14. The top frame 12 and bottom frame 14 are designed to enable the circuit board 20 to withstand high shock and vibration environments by stabilizing and reinforcing the circuit board I/O connectors 22 and other circuit board components 24. In addition to supporting the circuit board 20, the frame 11 also creates a method of transmitting thermal energy from the circuit board components 24. The card retainer 30 is mounted to the frame 11 via suitable mounting screws 29, as discussed further below.

Figure 2:
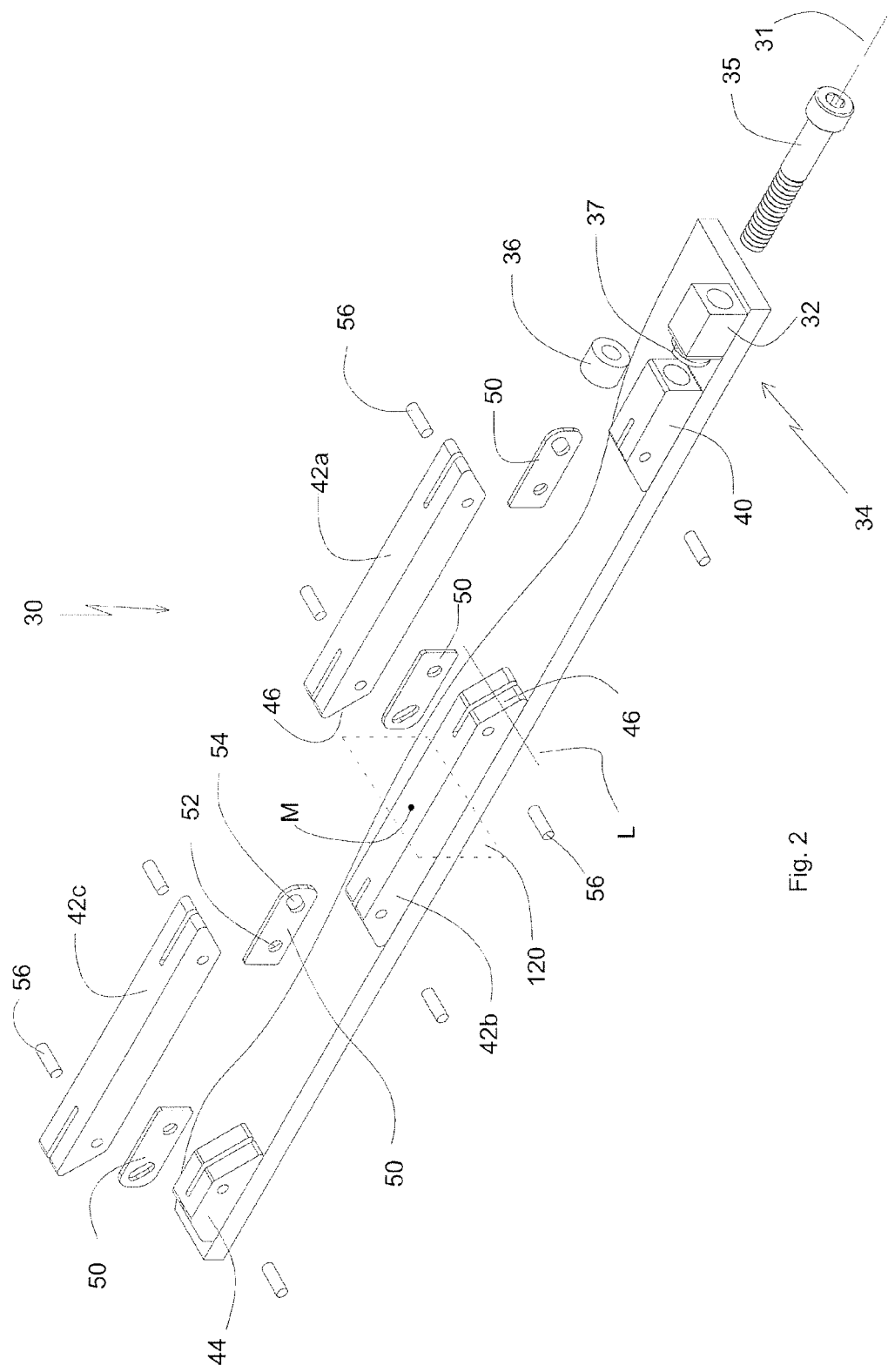
FIG. 2 shows an exploded view of a card retainer according to one embodiment of the invention.

One embodiment of the card retainer 30 is shown in FIG. 2. In general terms, the card retainer 30 of FIG. 2 includes a plurality of segments arranged in sequence along a centerline or longitudinal axis 31. The segments include front mounting block 32 with associated driver assembly 34, a front drive block 40, intermediate wedge members (42a, 42b, 42c, collectively 42), and a rear anchor wedge 44. The driver assembly 34 loosely extends through front mounting block 32 so as to be rotatable, but restrained from longitudinal movement relative to the mounting block 32. The driver assembly 34 includes a drive screw 35, a retaining collar 36, and a spring washer 37. The drive screw 35 is inserted through a corresponding smooth bore in mounting block 32 and then retaining collar 36 and spring washer 37 slid over a significant portion of the threaded portion of the drive screw 35. The retaining collar 36 is then secured to the drive screw 35, such as by suitable industrial adhesive (e.g., LOCTITE brand industrial adhesive). The presence of the retaining collar 36 prevents the drive screw from being removed from mounting block 32, and the spring washer 37 provides some tension to the system. The drive screw 35 is threaded into front drive block 40 so that the drive screw 35, when turned, screws further into or out of the drive block 40. The front drive block 40 is moveably connected to the first intermediate wedge 42a via guide strap 50 and pins 56, which may be spring pins. The guide straps 50 advantageously include a hole 52 and an angled slot 54, through which the pins 56 extend. The first intermediate wedge 42a is likewise moveably connected to the second intermediate wedge 42b via a guide strap 50, and second intermediate wedge 42b is moveably connected to third intermediate wedge 42c via a guide strap 50. The third intermediate wedge 42c is moveably connected to the rear anchor block 44 via a guide strap 50. As can be seen in FIG. 2, the front mounting block 32, the intermediate wedge members 42, and the rear anchor block 44 include angled bearing surfaces 46. The front mounting block 32 and rear anchor block 44 are static components of the card retainer 30, as they are mounted in place via screws 29 and not moved during expansion/contraction of the card retainer 30. For example, the card retainer 30 is secured to the card retainer contact surface 16 using a mounting screws 29 at the front mounting block 32 and rear anchor block 44. Alternatively, the card retainer 30 may be secured in a similar fashion directly to the circuit board 20.

To expand the card retainer 30, a torque is applied to the driver assembly (e.g., driver screw 35 is turned) to generate a longitudinal force that moves the front drive block 40 away from the mounting block 32. This force is transferred through the wedges 42 to the rear anchor block 44 and forces the retainer 30 to expand vertically (perpendicularly from the longitudinal axis 31). More particularly, the angle of the distal bearing face 46 of front drive block 40 (toward wedge 42a) in combination with the corresponding angle of the proximal bearing face 46 of intermediate wedge 42a causes the wedge 42a to be displaced distally (rearward) and vertically relative to the front drive block 40 as the two are forced together. Likewise, the longitudinal linear force and mating angles of the other bearing faces 46 force the other intermediate wedge members 42b, 42c to likewise be displaced toward rear mounting block 44, with every other wedge member 42 being displaced vertically as well. The height change created by this action locks the card retainer between the card retainer contact surface 16 and the chassis 70 to thereby lock the module assembly 5 in place. That is, the card retainer 30 is vertically expanded to fill the vertical clearance space of the corresponding slot 76 in the chassis "cold wall" not otherwise taken up by the LRU module 10. It should be noted that before, during, and after the movement, the various wedge members 42 are maintained in general lateral alignment by the guide straps.

Figure 3:
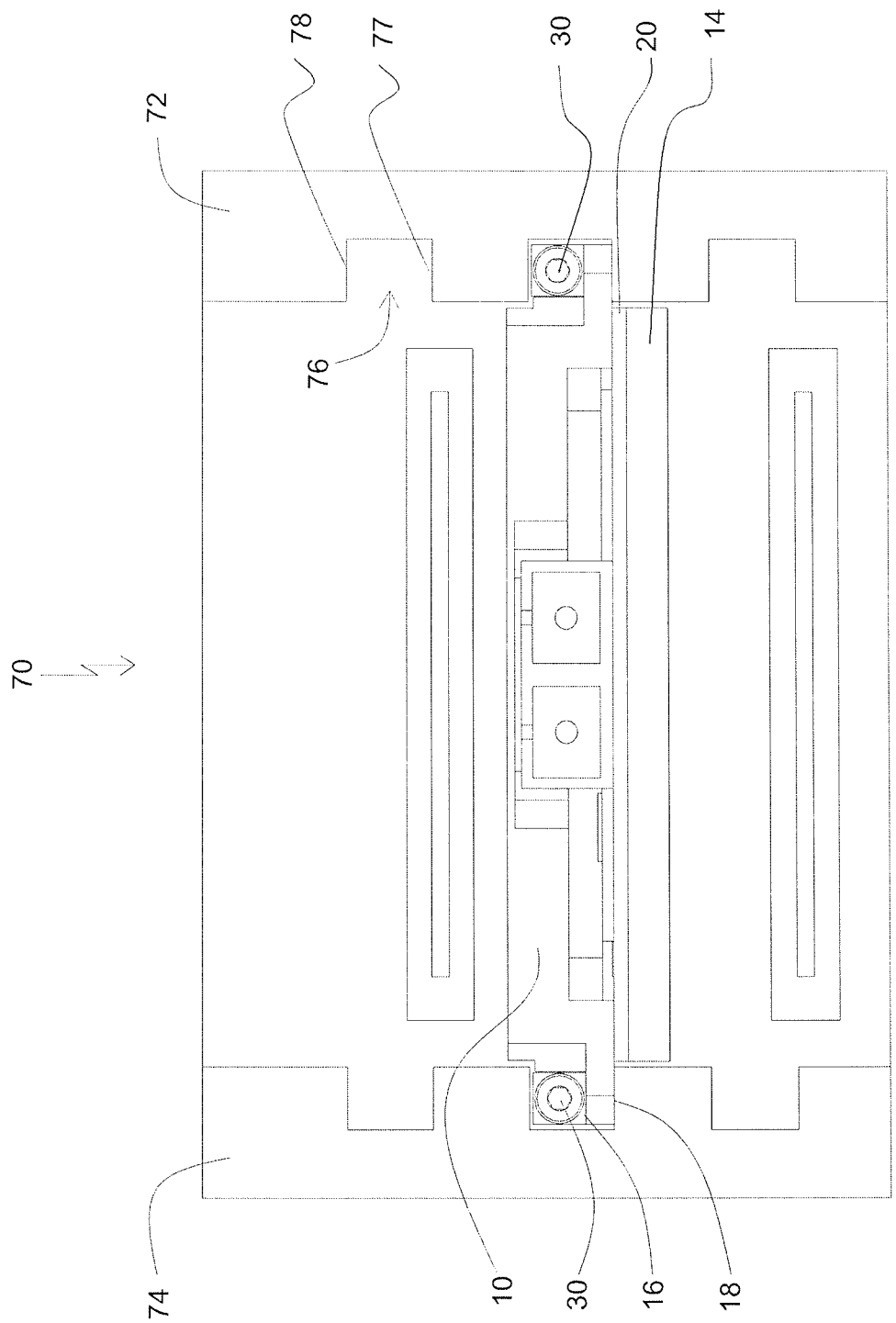
FIG. 3 shows the front view of an LRU mounted in a representative chassis.

In FIG. 3, a front view of the LRU module assembly 5 is shown seated in a chassis 70. The chassis 70 includes a right sidewall 72 and a left sidewall 74. Each sidewall 72,74 contains a series of alignment slots 76 with a lower contact surface 77 and an upper contact surface 78. The contact surfaces 77,78 help align and support the LRU module assembly 5 as well as provide a conductive path to dissipate the thermal energy therefrom. The perpendicular force described above from the card retainers 30 creates a frictional lock when expanded in chassis slot 76, with some wedges 42 in intimate contact with the slot's upper surface 78, and the module frame contact surface 18 in intimate contact with the slot's lower surface 77. This forced contact provides both a locking action and a thermal path for heat generated by LRU module assembly 5 (e.g., heat from the components 24 on circuit board 20).

Figure 4:
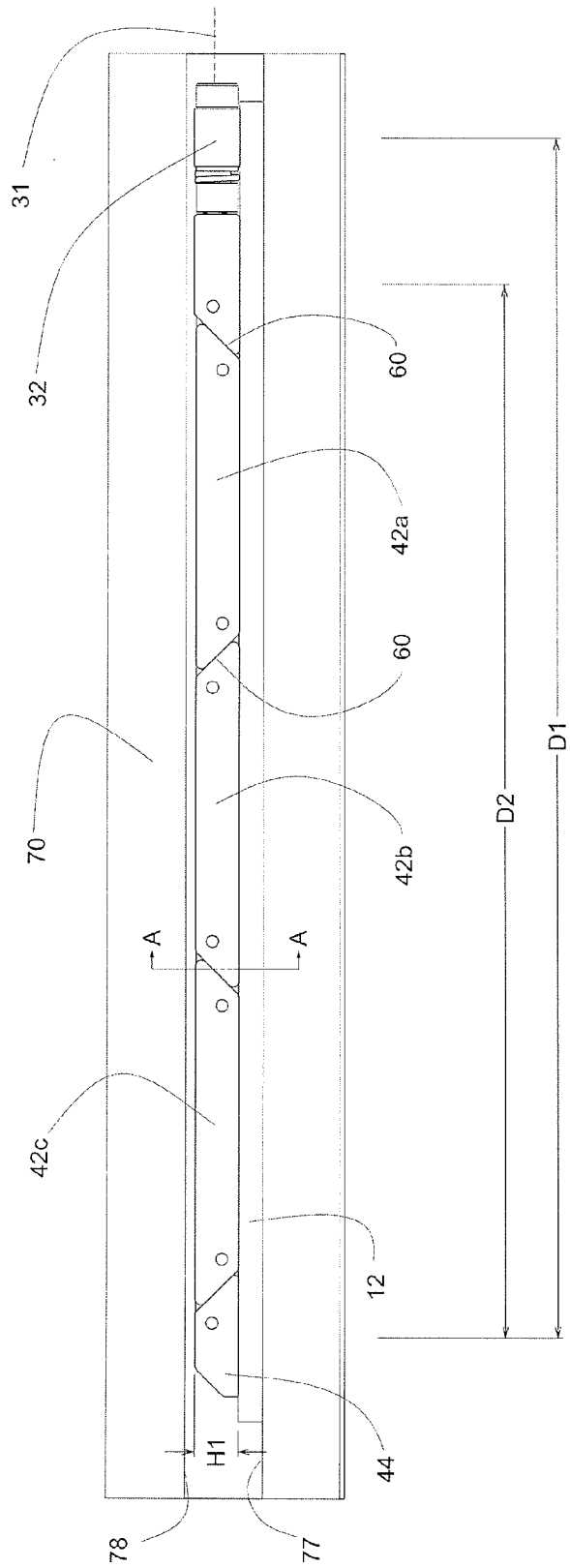
FIG. 4 shows a side view of the LRU module assembly in a chassis slot with the card retainer of FIG. 2 in a retracted state.
Figure 5:
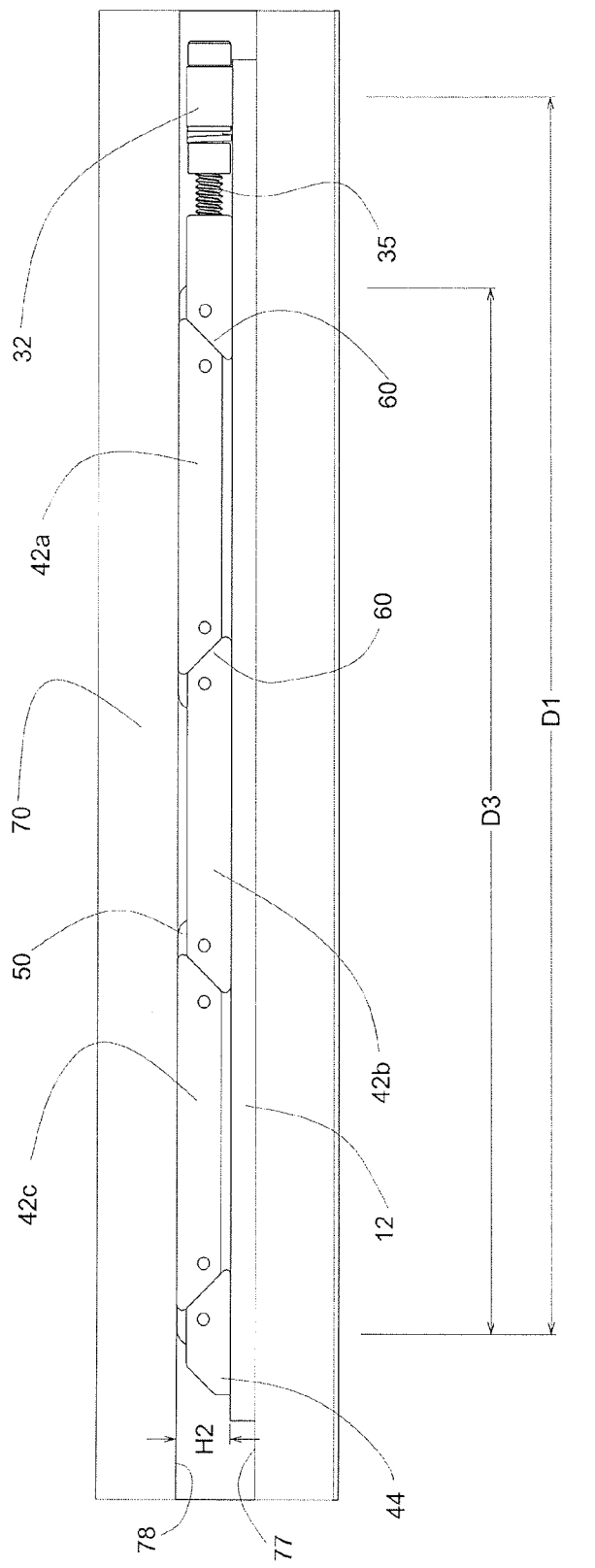
FIG. 5 shows a side view of the LRU module assembly in a chassis slot with the card retainer of FIG. 2 in a locked expanded state.

The expansion of the card retainer 30 may be seen in FIGS. 4-5. FIG. 4 shows the card retainer 30 in a slot 76 in the relaxed or retracted state. When the card retainer 30 is in the relaxed state, the LRU assembly module 5 may slide in and out of the chassis slot 76 with its alignment loosely provided by the chassis lower contact surface 77 and upper contact surface 78. In the retracted state, the distance (center to center) between front mounting block 32 and anchor segment 44 is D1, and the distance from drive block 40 to anchor segment is D2, and the height of the card retainer is H1. The expanded state is shown in FIG. 5, where the upper surfaces of wedges 42a, 42c are in intimate contact with (press against) surface 78. Similarly, the module frame contact surface 18 is in intimate contact with surface 77. When deployed, the distance between front mounting block 32 and anchor segment 44 remains at D1, but the distance from drive block 40 to anchor segment shortens to D2, and the height of the card retainer increases to H2. In some embodiments, H2 may be 20%-40% more than H1.

Figure 6:
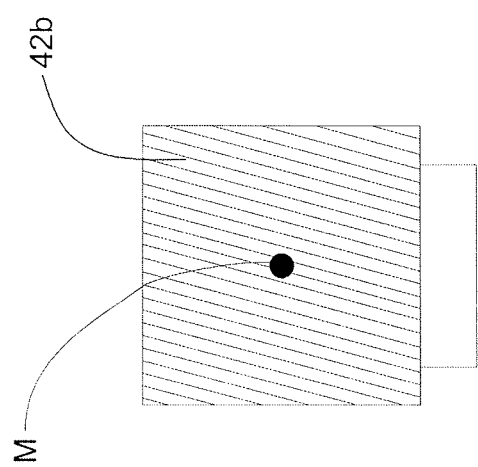
FIG. 6 shows a cross section of the card retainer of FIG. 2 at a midpoint of a wedge segment in a plane normal to the longitudinal axis.

The card retainer 30 does not have a longitudinal member that extends through or along more than three wedge member segments 42, and particularly not end to end. The card retainer 30 is advantageously anchored to the frame 11 surrounding the circuit board 20 (or the board itself) at a mounting block 32 disposed proximate one end of the card retainer 30 and at an anchor block 44 located farthest from the mounting block, and not in between. The card retainer 30 has wedge-shaped members (at least wedge members 42) that may be pivotally linked to each other. In some embodiments, the card retainer 30 changes from a smaller vertical height configuration to a larger vertical height configuration by moving at least three wedge members 42, with the wedge members 42 not longitudinally displaced along a common internal longitudinal element (e.g., central rod, shaft). In one embodiment, the card retainer 30 comprises a plurality of moveable wedge members 42 arranged along a central longitudinal axis 31 in a collapsed configuration, wherein in the expanded configuration, a cross-sectional line L extending through a wedge member 42 normal to the axis 31 and in a plane P that contains the axis 31 is not more than 20% open or not wedge member, and advantageously 15% or less. That is, at least 80% or more of the cross-section of the card retainer 30 at the level of the centerline (in the expanded state) is material of the wedges 42, and therefore part of the thermal path. In one embodiment, the card retainer 30 comprises a plurality of moveable wedge-shaped members 42 that have angled wedge bearing surfaces 46 angled at an angle, with adjacent wedged-shaped members in contact with each other across at least 50% of the cross-sectional area of the card retainer 30 at that angle at the interface 60, advantageously about 70% or more, and preferably about 80% or more. In one embodiment, the card retainer 30 is affixed in place at two separated points, with a plurality of wedge members 42 disposed between the points that longitudinally move toward each other to change the card retainer 30 from a collapsed configuration to an expanded configuration. In some embodiments, some or all of the movable wedge segments are designed such that no other portions of locking retainer that the wedge segment is movable relative to extends through a theoretical plane that is disposed at a midpoint of the wedge segment and oriented normal to the longitudinal axis. For example, as shown in FIG. 2, middle wedge segment 42b of card retainer 30 has a midpoint M. A plane 120 that is normal to axis 31 at point M does not have any other portions of the card retainer 30 that are movable relative to wedge segment 42b (when card retainer is mounted) extending therethrough. See FIG. 6. Similar analysis may apply to other card retainers describe herein. In various embodiments, the present invention has one or more of the above attributes, alone or in any combination.

Figure 7:
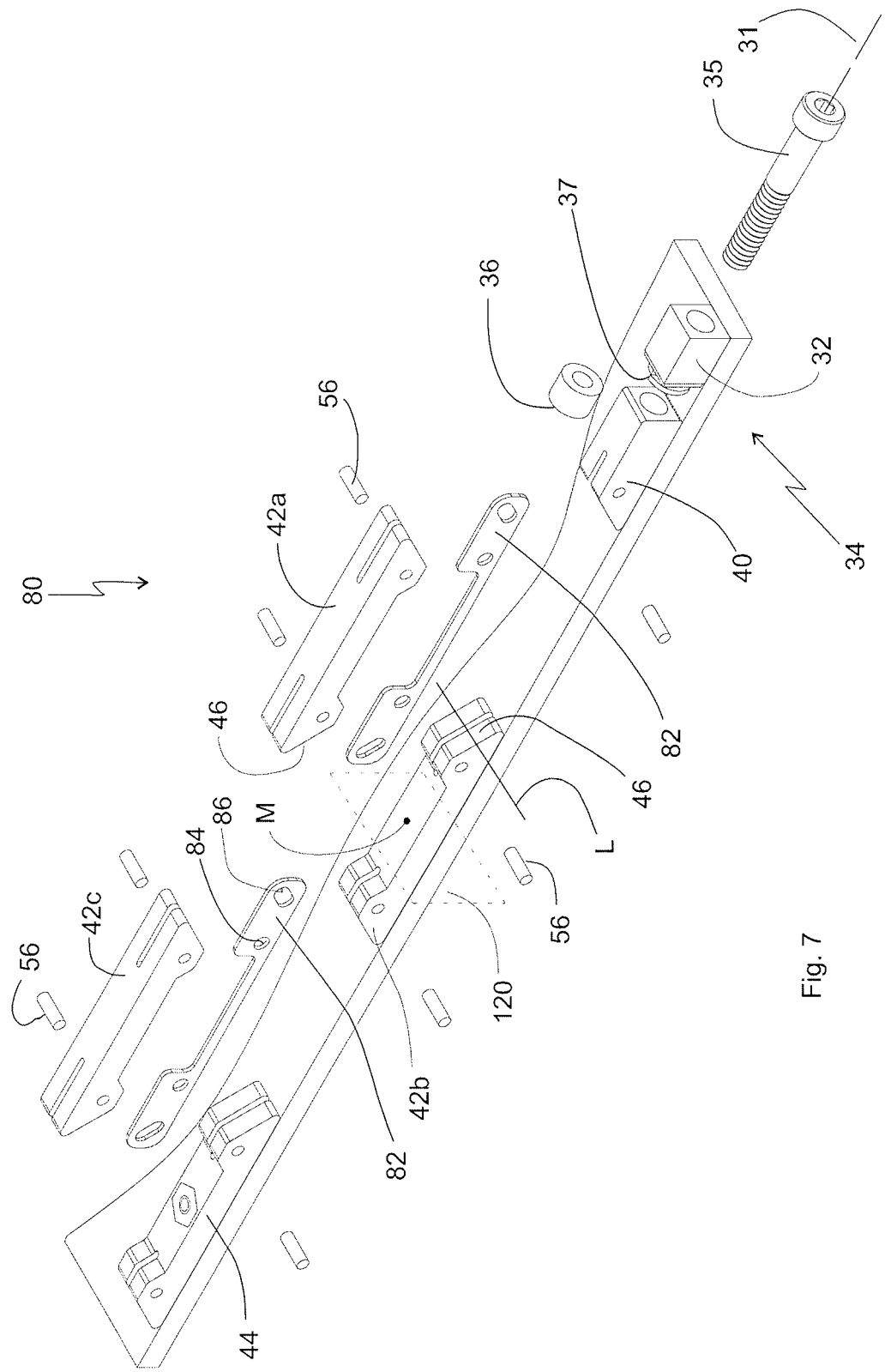
FIG. 7 shows an alternative embodiment of a card retainer.
Figure 8:
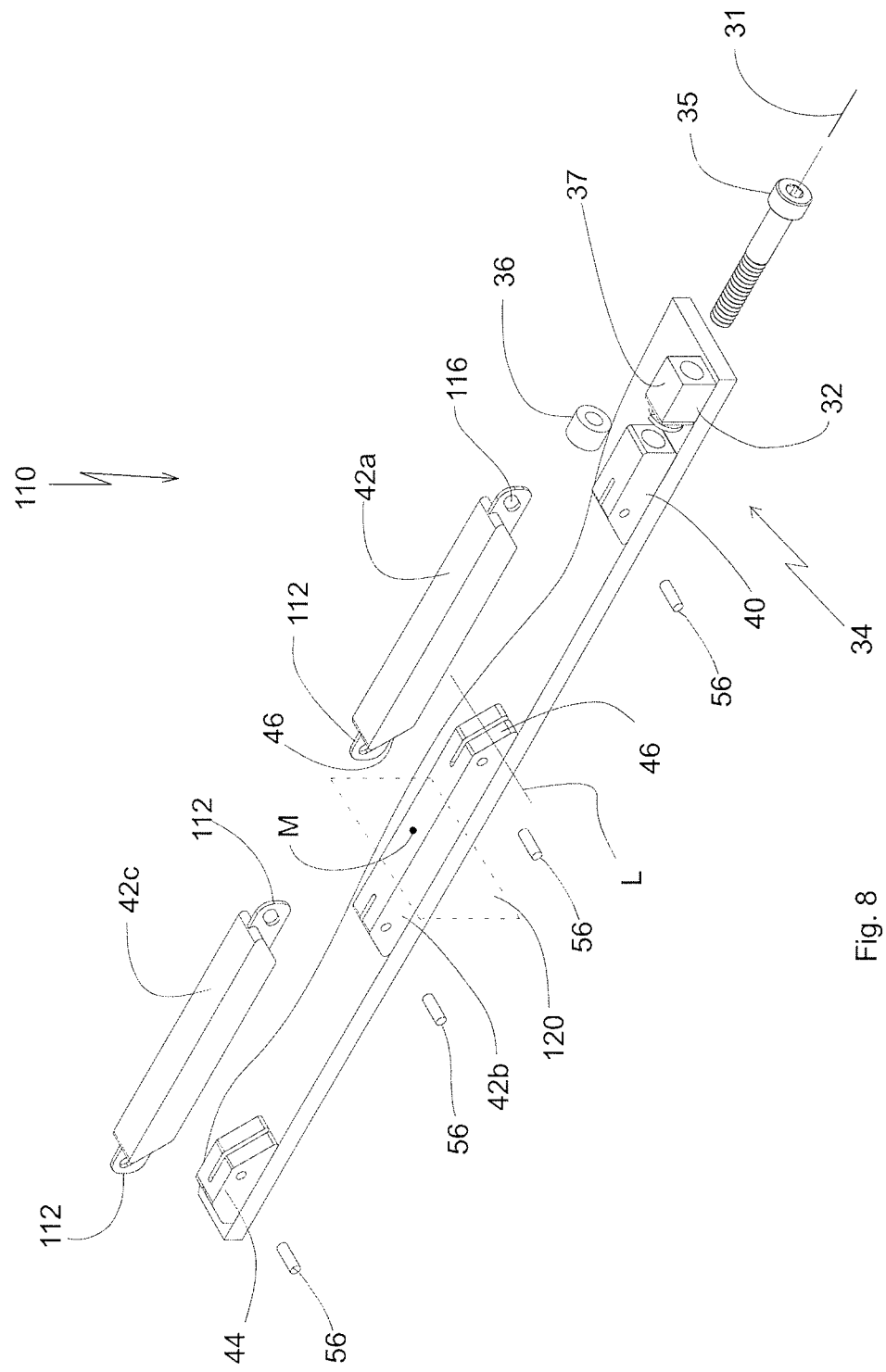
FIG. 8 shows another alternative embodiment of a card retainer with integral tabs.

In the illustrative embodiment discussed above, each guide strap 50 is mounted to two adjacent wedges. In particular, each guide strap 50 is mounted to one wedge via a pin 56 through hole 52 in a more constrained way, and mounted to and adjacent wedge via a pin 56 though slot 54 in a less constrained way. The mounting via the slot 54 allows the guide strap 50 to accommodate the vertical displacement between adjacent wedges described above. However, in some embodiments, some of the guide straps 50 may be mounted to three wedges. For example, the card retainer 80 of FIG. 7 has guide straps 82 that are firmly mounted to one wedge (e.g., wedge 42a) via pins 56 in holes 84, and more loosely mounted to the adjacent wedges (e.g., drive wedge 40 and wedge 42b) via pins 56 in angled slots 86. Such an arrangement is possible because wedge 42a is displaced vertically with respect to both of its adjacent wedges. In another embodiment, shown in FIG. 8, the guide straps 50 are replaced by tabs 112 which are integral with selected wedge segments. For example, the wedge segments 42a, 42c of card retainer 110 have integrally formed tabs 112. These tabs have angled slots 116 that perform the function of angled slots 54 in the embodiment of FIG. 2. Pins 56 moveably secure the tabs 112 to the adjacent segments.

Figure 9:
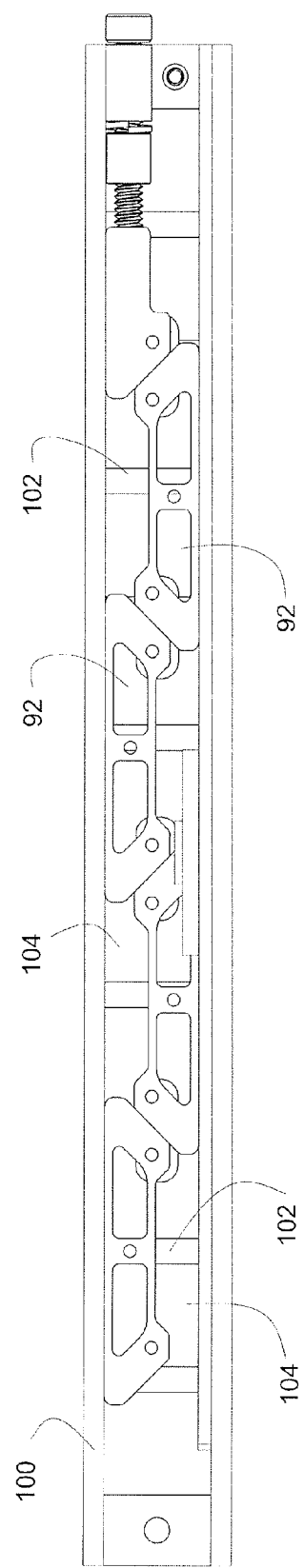
FIG. 9 shows a side view of an air cooled card retainer expanded in a chassis channel.
Figure 10:
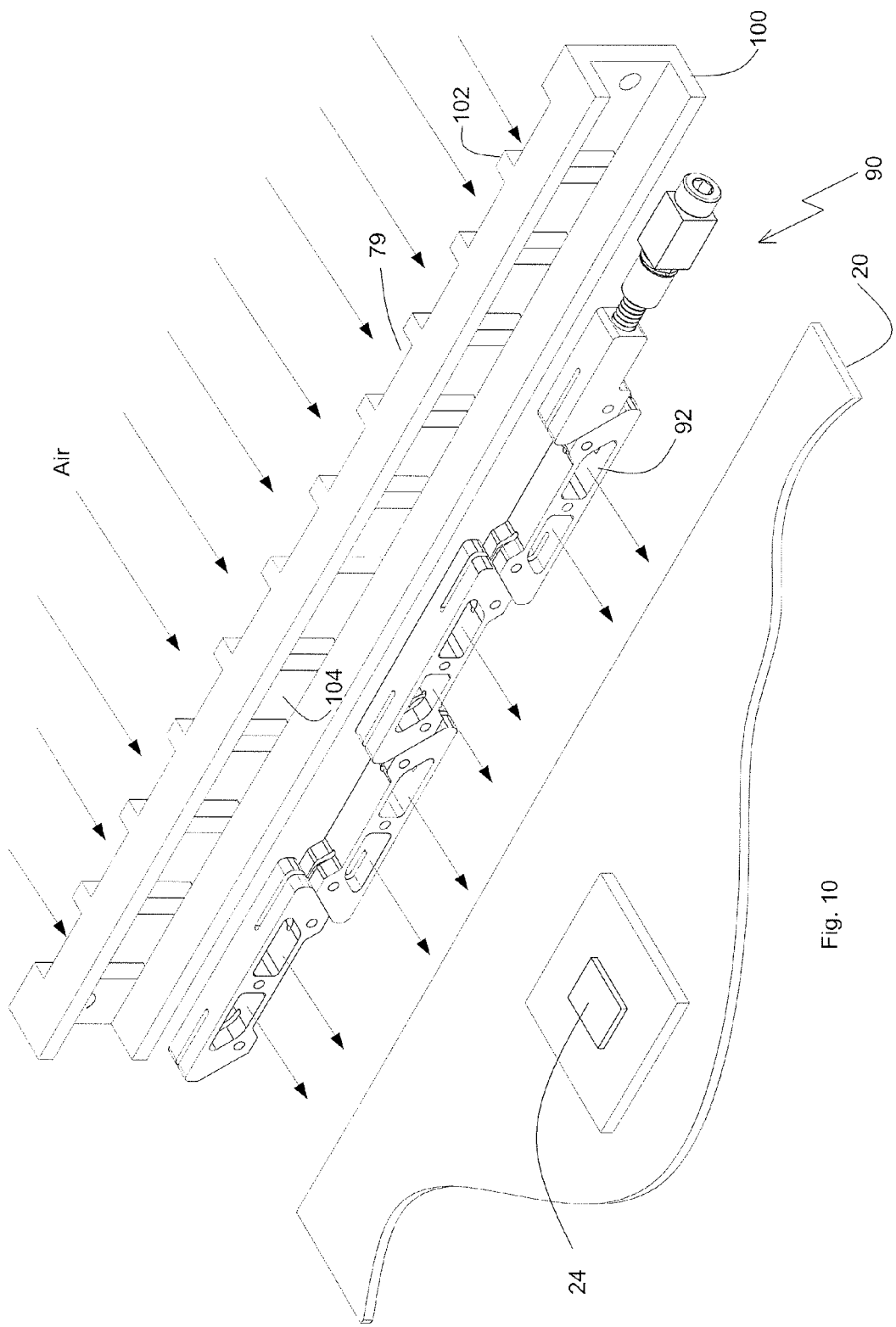
FIG. 10 shows an partially exploded perspective view of FIG. 9.

Another alternative embodiment of the card retainer 30 is shown in FIGS. 9-10, and indicated at 90, is believed advantageous for air cooled applications. This embodiment of the card retainer 90 is similar to card retainer 30, but some or all of the wedges 42 are provided with lateral through passages or cutouts 92. Card retainer 90 functions similarly to card retainer 30 described above in that it clamps and retains the LRU module 10. Further, while card retainer 90 may be mounted to a chassis 70 directly, card retainer 90 (or other card retainers described herein) may be mounted to the chassis 70 via a mounting channel 100. The mounting channel 100 could be part of a chassis 70 or a separate standalone part that is secured to the chassis 70. The channel 100 typically includes ribs 102 to allow the mounting channel 100 to accommodate the clamping force generated by the card retainer 90. The mounting channel 100 includes side openings 104 that allow air to pass therethrough. The side openings 104 and lateral openings (or cross-sectional through passages) 92 of the wedges of card retainer 90 allow air to pass to/from a cooling air plenum 79 in chassis 70. As with card retainer 30, card retainer 90 may be mounted to the circuit board 20 or frame 11 of the LRU module 10. The ability of the card retainer 90 to allow air to pass through it is allowed or improved due to the lack of a center supporting member that extends the length of the device. In the prior art, the center member or shaft would block or at least substantially impede, such air flow. Because the center member is eliminated in the card retainer 90, the wedge members 42 can be designed to allow air to pass therethrough to cool the electronic modules.

Figure 11:
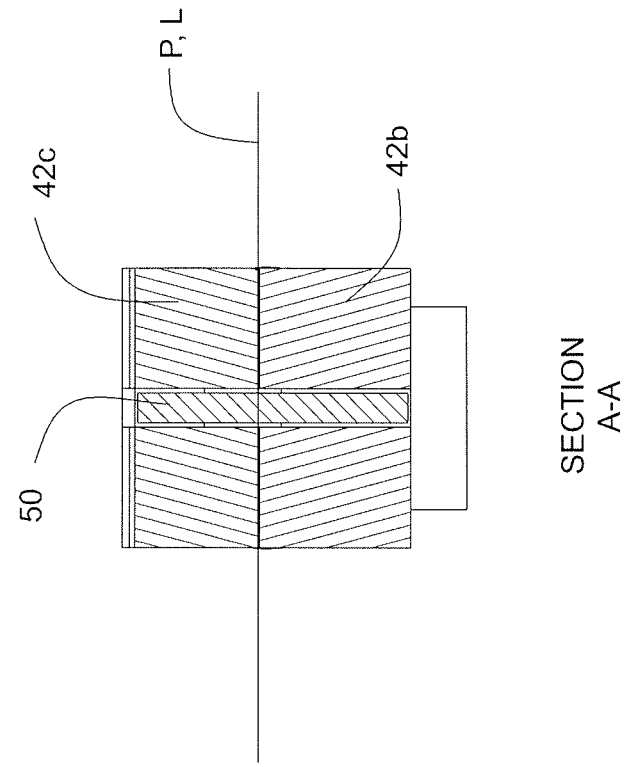
FIG. 11 shows the cross section A-A from FIG. 4.

FIG. 11 shows the cross sectional contact area between an upper wedge segment 42c and a lower wedge segment 42b of the card retainer 30. As can be seen, the elimination of the center support member of the prior art creates an increased cross sectional area of the wedge segments 42b,42c. The guide strap 50 occupies a smaller percentage of the wedge segments and allows for a significant increase in the thermal performance of the card retainer 30. Similar analysis may apply to other card retainers described herein.

In the discussions above, it was assumed that the rear anchor block 44 included an angled bearing face 46 for slidably engaging the adjacent wedge member 42. As such, the rear anchor block 44 acted as a wedge member and could be considered as a terminal wedge member segment. However, such is not required in all embodiments. In some embodiments, not illustrated, the rear anchor block 44 may not include an angled bearing surface, but instead may take the form of a simple block that provides a stop for the last wedge member 42 to bear against without providing a vertical component of force. In such situations, the rear anchor block segment 44 would not be considered a wedge member. Likewise, the above description has assumed that the drive block 40 includes an angled bearing face 46 for imparting both longitudinal and vertical force to the adjacent wedge segment 42. However, such is not required, and the front drive block or segment 40 may not include an angled bearing face if desired and may instead simply abut the adjacent wedge member 42 across an interface that is substantially normal to the longitudinal axis. Further, the discussion above has been in the context of the centerline 31 being collinear with the axis of rotation of the drive screw 35. While such is believed to be an advantageously compact arrangement, other embodiments may have the drive screw 35 located on a parallel axis if desired. Further still, other approaches to moving the drive segment 40 may be employed rather than a drive screw arrangement, such as a cam-based system, a quarter-turn fastener, and the like. Further, the mounting block 32 and the anchor block 44 may, in some embodiments, be formed as permanently attached portions of the frame 11 (e.g., integrally formed therewith and/or fused thereto) and operatively connected to the intermediate wedge members 42 via drive screw 35 and a pin 56 through the last guide strap 50.

The discussions above have been in the context of the card retainer 30 being oriented so that the anchoring points at the mounting block 32 and the anchor block 44 are "down" relative to the "up" expansion direction. However, it should be understood that inverted installations are also within the scope of the present invention, as shown by the card retainer 90 of FIGS. 9-10.

In general, the card retainers 30, 80, 90 may be made from any suitable material, particularly metals and metal alloys. Advantageously, the mounting block 32, drive block 40, anchor block 44, intermediate wedge segments 42 are made from aluminum or aluminum alloys, while the guide strips 50, 82, pins 56, and screws 29, 35, and the like are from stainless steel. In some embodiments, some or all of the card retainers 30, 80, 90, such as anchor block 44 and intermediate wedge segments 42, may be made from polymers, such as ABS, although such may reduce the thermal benefits of the design.

The present invention may, of course, be carried out in other specific ways than those herein set forth without departing from the scope of the invention. The present embodiments are, therefore, to be considered in all respects as illustrative and not restrictive, and all changes coming within the meaning and equivalency range of the appended claims are intended to be embraced therein.

What is claimed is:

1. A locking retainer assembly comprising:
    a substrate;
    an elongate locking retainer anchored to the substrate; the locking retainer changeable in height and comprising:
        a proximal mounting segment;
        a distal anchor segment;
        one or more intermediate wedge members disposed between the mounting segment and the anchor segment in longitudinal sequence;
    wherein the mounting segment and the distal anchor segment are secured to the substrate in fixed relation thereto; wherein all intermediate wedge members are longitudinally movable relative to both the substrate and the distal anchor segment;
    wherein the locking retainer is movable between a first configuration having a relatively smaller height and a second configuration having a relatively larger height by moving the one or more intermediate wedge members away from the proximal mounting segment toward the distal anchor segment with the proximal mounting segment and the distal anchor segment remaining in fixed positions relative to the substrate.

2. The locking retainer assembly of claim 1 wherein the one or more intermediate wedge members comprise three or more intermediate wedge members.

3. The locking retainer assembly of claim 1 wherein the locking retainer further comprises a plurality of links connecting adjacent intermediate wedge members.

4. The locking retainer assembly of claim 3 wherein none of the links mounts to more than two wedge members.

5. The locking retainer assembly of claim 3 wherein none of the links mounts to more than three wedge members.

6. The locking retainer assembly of claim 1 wherein the substrate comprises a circuit board.

7. The locking retainer assembly of claim 1 wherein the substrate is a housing generally surrounding a circuit board.

8. The locking retainer assembly of claim 1:
wherein the one or more intermediate wedge members comprises first and second adjacent wedge members;
wherein the first and second adjacent wedge members have respective angled wedge bearing surfaces angled at an angle;
wherein, in the second configuration, the first and second wedge members are in contact with each other at their interface across at least 70% of a cross-sectional area of the locking retainer at that angle at the interface.

9. The locking retainer assembly of claim 1 wherein the one or more intermediate wedge members each comprise lateral through passages.

10. A locking retainer comprising:
at least three wedge members movably linked to each other and disposed in longitudinal sequence along a longitudinal axis; the at least three wedge members comprising a middle wedge member disposed between the other two of the three wedge members;
wherein the locking retainer is movable between a first configuration having a relatively smaller height and a second configuration having a relatively larger height by moving the wedge members longitudinally such that a longitudinal distance between a first wedge member and a last wedge member of the sequence becomes smaller without the wedge members being longitudinally displaced along a common internal longitudinal element;
wherein all portions of the locking retainer that the middle wedge member is longitudinally moveable relative to do not extend through a theoretical plane disposed at a longitudinal midpoint of the middle wedge member and oriented normal to the longitudinal axis.

11. The locking retainer of claim 10 further comprising a plurality of links moveably connecting adjacent wedge members but distinct therefrom; wherein each link contacts at least two, but not more than three wedge members.

12. The locking retainer of claim 10 wherein the locking retainer, in the first configuration, comprises a longitudinally extending centerline; wherein respective cross-sectional lines through each wedge member extending normal the centerline and in a plane containing the centerline are not more than 20% open.

13. The locking retainer of claim 12 wherein the cross-sectional lines are not more than 15% open.

14. The locking retainer of claim 10 wherein the middle and a second wedge member adjacent thereto have respective angled wedge bearing surfaces angled at an angle; wherein, in the second configuration, the middle and second wedge members are in contact with each other at their interface across at least 50% of a cross-sectional area of the locking retainer at that angle at the interface.

15. The locking retainer of claim 14 wherein the middle and second wedge members are in contact with each other at their interface across at least 70% of the cross-sectional area of the locking retainer at that angle at the interface.

16. A locking retainer comprising:
a plurality of wedge members including at least a first, second, third, fourth, and fifth wedge members arranged sequentially along a longitudinal axis, with the first wedge member disposed most proximally and the fifth wedge member disposed most distally;
a plurality of links movably connecting adjacent wedge members; wherein no link extends for more than three wedge members;
a mounting segment disposed proximally from the first wedge member;
wherein the retainer is moveable between a retracted configuration and an extended configuration:
wherein, in the retracted configuration:
the retainer has first height normal to the longitudinal axis;
the mounting segment and the fifth wedge are separated by a first distance;
the first wedge and fifth wedge are separated by a second distance;
wherein, in the extended configuration:
the retainer has second height normal to the longitudinal axis; the second height greater than the first height;
the mounting segment and the fifth wedge are separated by the first distance;
the first wedge and fifth wedge are separated by a third distance; the third distance less than the second distance.

17. The locking retainer of claim 16 wherein the adjacent wedge members are pivotally linked to each other.

18. The locking retainer of claim 17 further comprising a sixth wedge member and a seventh wedge member disposed sequentially between the fourth wedge member and the fifth wedge member.

19. The locking retainer of claim 16 wherein the second, third, and fourth wedge members each include angled bearing faces on their respective proximal and distal ends.

20. The locking retainer of claim 16 wherein the links are joined to their respective wedge members by pins disposed transverse to the longitudinal axis.

* * * * *